US009509293B2

(12) United States Patent
Li et al.

(10) Patent No.: US 9,509,293 B2
(45) Date of Patent: Nov. 29, 2016

(54) METHOD AND APPARATUS FOR CONTROLLING CHIP PERFORMANCE

(71) Applicant: Huawei Technologies Co., Ltd., Shenzhen, Guangdong (CN)

(72) Inventors: Xiangpeng Li, Shanghai (CN); Yu Liu, Shanghai (CN); Cong Yao, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 860 days.

(21) Appl. No.: 13/870,744

(22) Filed: Apr. 25, 2013

(65) Prior Publication Data

US 2013/0293269 A1 Nov. 7, 2013

(30) Foreign Application Priority Data

Apr. 26, 2012 (CN) .......................... 2012 1 0126761

(51) Int. Cl.
*H03B 19/00* (2006.01)
*H03K 5/00* (2006.01)
*G06F 1/20* (2006.01)
*G06F 1/32* (2006.01)

(52) U.S. Cl.
CPC ........... *H03K 5/00006* (2013.01); *G06F 1/206* (2013.01); *G06F 1/324* (2013.01); *G06F 1/3296* (2013.01); *Y02B 60/1217* (2013.01); *Y02B 60/1285* (2013.01)

(58) Field of Classification Search
CPC . H03K 5/00006; G06F 1/206; G06F 1/3296; G06F 1/324; Y02B 60/1285; Y02B 60/1217

USPC .......................... 374/170, 178; 327/512, 513
See application file for complete search history.

(56) References Cited

U.S. PATENT DOCUMENTS 8,635,470 B1 * 1/2014 Kraipak .................. G06F 1/206
713/300

FOREIGN PATENT DOCUMENTS

| CN | 1936858 A | | 3/2007 |
|---|---|---|---|
| CN | 1979361 A | | 6/2007 |
| CN | 102055166 | * | 5/2011 |
| CN | 102055166 A | | 5/2011 |
| JP | 2007233782 A | | 9/2007 |

* cited by examiner

*Primary Examiner* — Lisa Caputo
*Assistant Examiner* — Janice M Soto
(74) *Attorney, Agent, or Firm* — Leydig, Voit & Mayer, Ltd.

(57) ABSTRACT

Embodiments of the present invention disclose a method and an apparatus for controlling chip performance, and relate to the field of communications technologies, which solves a problem in the prior art that a chip is reset or performance is greatly decreased as long as a temperature of the chip is higher than a preset threshold. The method includes: obtaining a working temperature of a chip; when the working temperature of the chip reaches one of multiple preset temperature thresholds, obtaining, according to preset correspondence between a temperature threshold and a chip performance control policy, a chip performance control policy that corresponds to the one of the multiple temperature thresholds; and controlling working of the chip according to the control policy. The present invention is applicable to an electronic device to which a chip is applied, such as a desktop computer or a notebook computer.

8 Claims, 3 Drawing Sheets

METHOD AND APPARATUS FOR CONTROLLING CHIP PERFORMANCE

CROSS-REFERENCE TO RELATED APPLICATION

This application claims priority to Chinese Patent Application No. 201210126761.2, filed on Apr. 26, 2012, which is hereby incorporated by reference in its entirety.

FIELD OF THE INVENTION

The present invention relates to the field of communications technologies, and in particular, to a method and an apparatus for controlling chip performance.

BACKGROUND OF THE INVENTION

Electronic devices such as a desktop computer and a notebook computer have been widely used in current life, and a great number of chips work in the electronic devices. As people have a higher requirement for performance of a chip gradually, power consumption of the chip increases accordingly. Therefore, heat dissipation of the chip also becomes an important factor of affecting stable working of the chip. When a temperature of the chip is excessively high, the electronic device runs unstably and is even broken down. For example, when a large game runs in a desktop computer, a graphic processing unit (Graphic Processing Unit, referred to as GPU) of a display card of the desktop computer works at a high frequency and a high voltage, thereby generating a large amount of heat. When a temperature of the GPU is excessively high, the GPU is probably damaged.

In the prior art, in order to avoid a problem that a chip in the electronic device works at a high temperature and is damaged, the following solutions are provided: a temperature sensor (Temperature sensor) disposed in the electronic device is used to obtain a temperature of the chip in real time, and when the temperature of the chip is higher than a preset threshold (for example, higher than a safe temperature of the chip), performance of the chip is decreased to a lower standard (for example, a clock frequency and a power supply voltage of a control module of the chip are decreased) or the chip is directly reset (for example, an electronic device such as a desktop computer or a notebook computer is directly restarted when a temperature of a display card is excessively high), thereby decreasing the temperature of the chip.

During implementation of embodiments of the present invention, the inventor finds that the prior art has at least the following problems.

In an actual application, as long as the temperature of the chip is higher than the preset threshold, the chip is reset or the performance is greatly decreased, thereby resulting in a problem that the chip is applied inconveniently and user experience is poor.

SUMMARY OF THE INVENTION

Embodiments of the present invention provide a method and an apparatus for controlling chip performance, which can solve, to some extent, a problem in the prior art that a chip is applied inconveniently and user experience is poor because the chip is reset or performance is greatly decreased when a temperature of the chip is higher than a preset threshold.

In order to achieve the foregoing objectives, the present invention adopts the following technical solutions.

A method for controlling chip performance includes:
obtaining a working temperature of a chip;
when the working temperature of the chip reaches one of multiple preset temperature thresholds, obtaining, according to preset correspondence between a temperature threshold and a chip performance control policy, a chip performance control policy that corresponds to the one of the multiple temperature thresholds; and
controlling working of the chip according to the control policy.

An apparatus for controlling chip performance includes:
a working temperature obtaining unit, configured to obtain a working temperature of a chip;
a control policy obtaining unit, configured to, when the working temperature of the chip, which is obtained by the working temperature obtaining unit, reaches one of multiple preset temperature thresholds, obtain, according to preset correspondence between a temperature threshold and a chip performance control policy, a chip performance control policy that corresponds to the one of the multiple temperature thresholds; and
a controlling unit, configured to control working of the chip according to the control policy.

With the method and the apparatus for controlling chip performance provided in the embodiments of the present invention, because multiple temperature thresholds are preset and the multiple temperature thresholds correspond to multiple chip performance control policies, when a working temperature of a chip is obtained and the working temperature of the chip reaches one of the multiple temperature thresholds, working of the chip can be controlled according to a chip performance control policy that corresponds to the temperature threshold. Compared with the prior art, in the embodiments of the present invention, multiple temperature thresholds are set, which correspond to different chip performance control policies, so that when the temperature of the chip is excessively high, a problem that the chip is reset directly or working performance of the chip is decreased greatly is avoided, and it is convenient for a user to apply the chip.

BRIEF DESCRIPTION OF THE DRAWINGS

To describe the technical solutions in the embodiments of the present invention more clearly, the accompanying drawings required for describing the embodiments are briefly introduced in the following. Apparently, the accompanying drawings in the following description show merely some embodiments of the present invention, and persons of ordinary skill in the art may still derive other drawings from these accompanying drawings without creative efforts.

DETAILED DESCRIPTION OF THE EMBODIMENTS

The technical solutions in the embodiments of the present invention are described clearly and in the following with reference to the accompanying drawings in the embodiments of the present invention. Apparently, the embodiments to be described are merely a part rather than all of the embodiments of the present invention. All other embodiments obtained by persons of ordinary skill in the art based on the embodiments of the present invention without creative efforts shall fall within the protection scope of the present invention.

In order to make the advantages of the technical solutions of the present invention more comprehensible, the present invention is described in detail in the following with reference to the accompanying drawings and embodiments.

Figure 1:
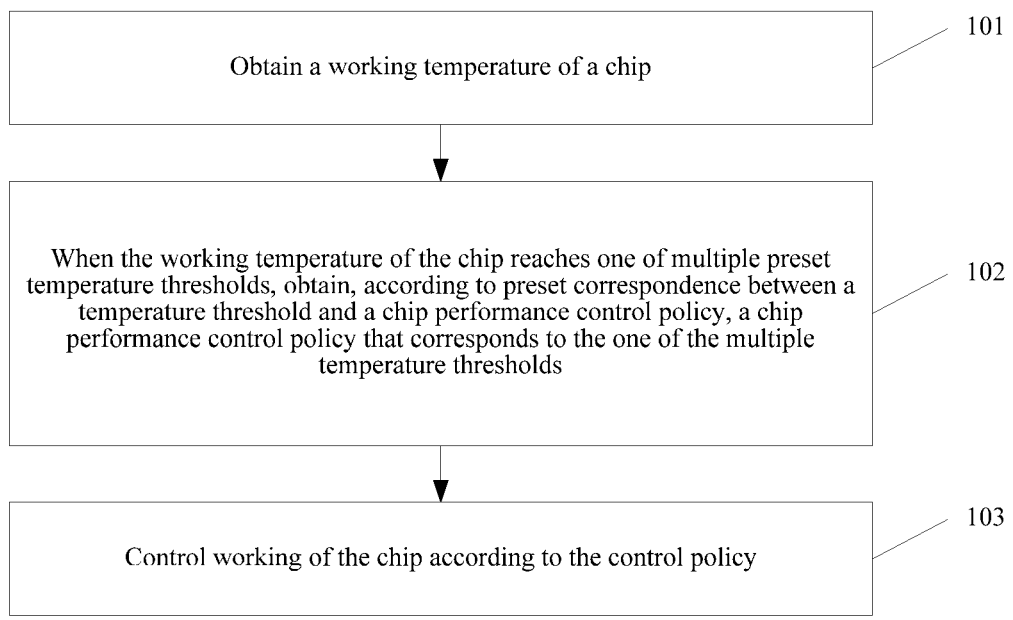
FIG. 1 is a flow chart of a method for controlling chip performance according to an embodiment of the present invention.

As shown in FIG. 1, an embodiment of the present invention provides a method for controlling chip performance, where the method includes:

Step 101: Obtain a working temperature of a chip.

Optionally, the working temperature of the chip may be detected by using a temperature senor in real time, to which this embodiment is not limited.

Step 102: When the working temperature of the chip reaches one of multiple preset temperature thresholds, obtain, according to preset correspondence between a temperature threshold and a chip performance control policy, a chip performance control policy that corresponds to the one of the multiple temperature thresholds.

Specifically, in order to control working of the chip, multiple temperature thresholds are preset. For example, a safe temperature of the chip is used as a lowest temperature threshold and one temperature threshold is set every 10 degrees centigrade, to which this embodiment is not limited. Chip performance control policies corresponding to the multiple temperature thresholds are also preset.

For example, if the safe temperature of the chip is 70 degrees centigrade (that is, when the working temperature of the chip is higher than 70 degrees centigrade, the chip has a risk of being damaged), 70 degrees centigrade is set as the lowest temperature threshold, and the following temperature thresholds are 80 degrees centigrade, 90 degrees centigrade, and 100 degrees centigrade respectively. In this case, corresponding chip performance control policies may be as follows: When the temperature is 70 degrees centigrade, a working frequency of the chip is controlled to decrease by 100 MHz; when the temperature is 80 degrees centigrade, the working frequency of the chip is controlled to decrease by 150 MHz; and when the temperature is 90 degrees centigrade, the working frequency of the chip is controlled to decrease by 180 MHz. When the temperature is relatively high, for example, 100 degrees centigrade, it is possible that chip performance cannot be decreased effectively by decreasing the working frequency to decrease the working temperature of the chip. Therefore, in order to avoid that the chip cannot be thoroughly protected by using a method of decreasing a working frequency, the 100 degrees centigrade is set as a reset threshold. When the working temperature of the chip reaches 100 degrees centigrade, the chip is reset directly. For example, a desktop computer is restarted, to which this embodiment is not limited. It should be noted that, multiple kinds of chip performance control policies may also exist according to different environments, which are not further described herein.

Step 103: Control working of the chip according to the control policy.

Specifically, when the working temperature of the chip reaches a certain temperature of multiple temperature thresholds, for example, 70 degrees centigrade, it is obtained that the working frequency of the chip should be controlled to decrease by 100 MHz when the temperature reaches 70 degrees centigrade; and in this case, an effect of decreasing chip performance by decreasing a working frequency of the chip by 100 MHz is achieved. Because the chip performance is decreased, the working temperature of the chip may be decreased to a temperature that is lower than 70 degrees centigrade, but it is also possible that the working temperature of the chip continues to increase to 80 degrees centigrade or higher. When the working temperature reaches another temperature threshold, working of the chip is controlled according to a chip performance control policy that corresponds to the another temperature threshold.

With the method for controlling chip performance provided in this embodiment of the present invention, because multiple temperature thresholds are preset and the multiple temperature thresholds correspond to multiple chip performance control policies, when a working temperature of a chip is obtained and the working temperature of the chip reaches one of the multiple temperature thresholds, working of the chip can be controlled according to a chip performance control policy that corresponds to the temperature threshold. Compared with the prior art, in this embodiment of the present invention, multiple temperature thresholds are set, which correspond to different chip performance control policies, so that when the temperature of the chip is excessively high, a problem that the chip is reset directly or working performance of the chip is decreased greatly is avoided, and it is convenient for a user to apply the chip.

Figure 2:
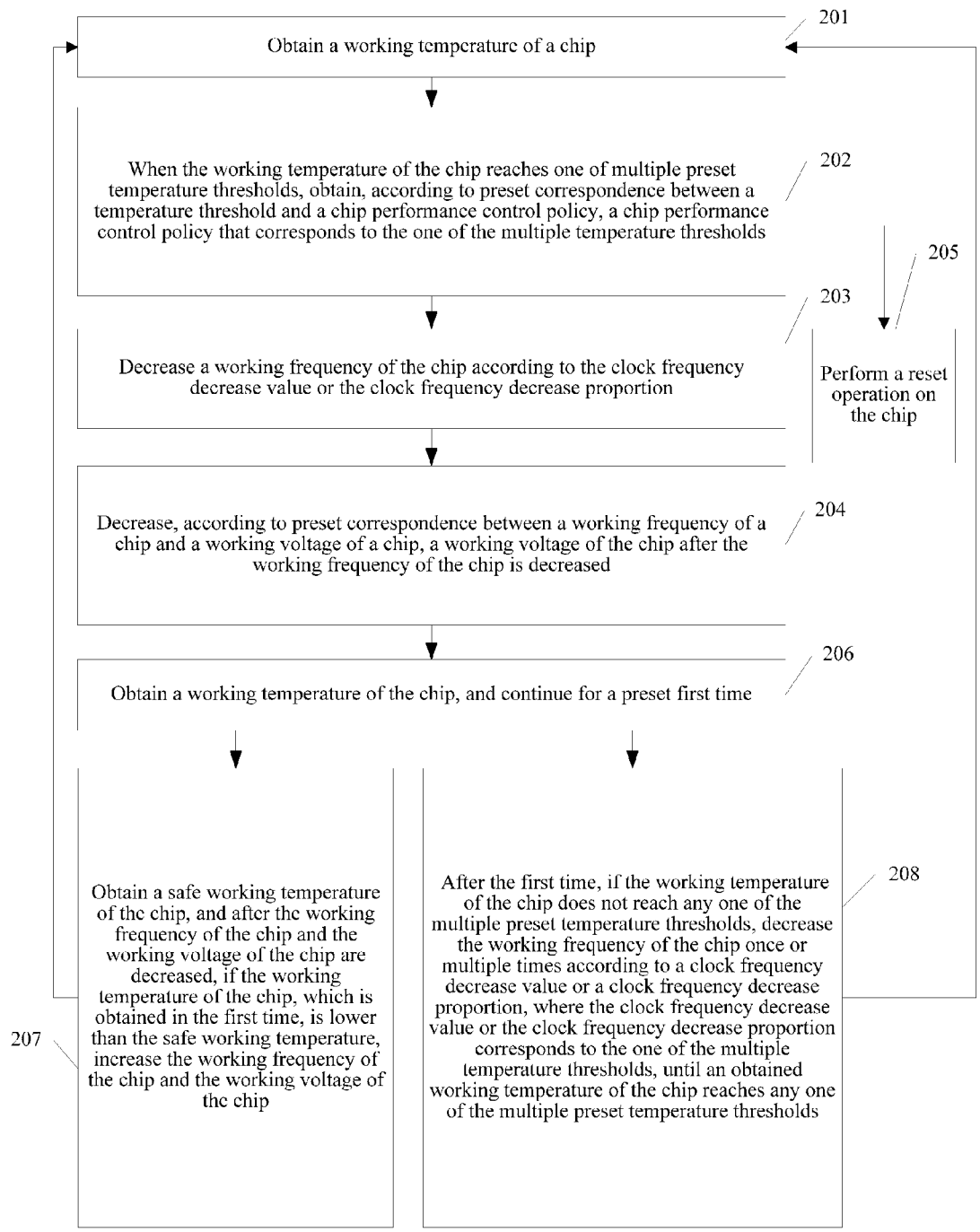
FIG. 2 is a flow chart of a method for controlling chip performance according to another embodiment of the present invention.

As shown in FIG. 2, another embodiment of the present invention provides a method for controlling chip performance, where the method includes:

Step 201: Obtain a working temperature of a chip.

Optionally, the working temperature of the chip may be detected by using a temperature senor in real time, to which this embodiment is not limited.

Step 202: When the working temperature of the chip reaches one of multiple preset temperature thresholds, obtain, according to preset correspondence between a temperature threshold and a chip performance control policy, a chip performance control policy that corresponds to the one of the multiple temperature thresholds.

If the chip performance control policy includes clock frequency decrease information that corresponds to each of the multiple temperature thresholds, where the clock frequency decrease information includes a clock frequency decrease value or a clock frequency decrease proportion, step 203 is executed. If the working temperature of the working chip reaches a maximum threshold of the multiple temperature thresholds, that is, a reset threshold, step 205 is executed.

Specifically, in order to control working of the chip, multiple temperature thresholds are preset. For example, a safe temperature of the chip is used as a lowest temperature threshold and one temperature threshold is set every 10 degrees centigrade, to which this embodiment is not limited. According to a different condition of each temperature threshold, a chip performance control policy corresponding to each temperature threshold is also set.

For example, if the safe temperature of the chip is 70 degrees centigrade (that is, when the working temperature of the chip is higher than 70 degrees centigrade, the chip has a risk of being damaged), 70 degrees centigrade is set as the lowest temperature threshold, and the following temperature thresholds are 80 degrees centigrade, 90 degrees centigrade, and 100 degrees centigrade respectively. In this case, corresponding chip performance control policies may be as follows: When the temperature is 70 degrees centigrade, a working frequency of the chip is controlled to decrease by 100 MHz; when the temperature is 80 degrees centigrade, the working frequency of the chip is controlled to decrease by 150 MHz; and when the temperature is 90 degrees centigrade, the working frequency of the chip is controlled to decrease by 180 MHz; or when the temperature reaches a certain temperature threshold, the working frequency of the chip may also be controlled to decease by a corresponding proportion, to which this embodiment is not limited. When the temperature is relatively high, for example, 100 degrees centigrade, it is possible that chip performance cannot be decreased effectively by decreasing the working frequency to decrease the working temperature of the chip. Therefore, in order to avoid that the chip cannot be thoroughly protected by using a method of decreasing a working frequency, the 100 degrees centigrade is set as a reset threshold. When the working temperature of the chip reaches 100 degrees centigrade, the chip is reset directly. For example, a desktop computer is restarted, to which this embodiment is not limited. It should be noted that, multiple kinds of chip performance control policies may also exist according to different environments, which are not further described herein.

Step 203: Decrease the working frequency of the chip according to the clock frequency decrease value or the clock frequency decrease proportion.

Specifically, chip performance is decreased by decreasing the working frequency of the chip, and therefore, the working temperature of the chip can be decreased, to which this embodiment is not limited.

Step 204: Decrease, according to preset correspondence between a working frequency of a chip and a working voltage of a chip, a working voltage of the chip after the working frequency of the chip is decreased. Step 206 is executed.

Specifically, a different working frequency of the chip corresponds to a different working voltage of the chip, and therefore, after the working frequency of the chip is decreased, it is also required to decrease the working voltage of the chip accordingly.

Step 205: Perform a reset operation on the chip.

Specifically, when the temperature is relatively high, for example, 100 degrees centigrade, it is possible that chip performance cannot be decreased effectively by decreasing the working frequency, and therefore, a reset operation is directly performed on the chip. For example, running of the chip is stopped and an electronic device to which the chip is applied is restarted, so as to prevent the chip from being damaged.

Step 206: Obtain a working temperature of the chip, and continue for a preset first time. Step 207 or 208 is executed.

Specifically, the working temperature of the chip is obtained in the first time, so as to detect whether an adopted chip performance control policy is effective, and according to different effects, further processing is performed. For details, reference is made to the following steps.

Step 207: Obtain a safe working temperature of the chip, and after the working frequency of the chip and the working voltage of the chip are decreased, if the working temperature of the chip, which is obtained in the first time, is lower than the safe working temperature, increase the working frequency of the chip and the working voltage of the chip. Go back to execute step 201.

Specifically, when the working temperature of the chip is lower than the safe working temperature, in order to improve the chip performance, the working frequency of the chip and the working voltage of the chip may be increased. The working frequency and the working voltage of the chip may be adjusted dynamically by using a dynamic voltage and frequency scaling (Dynamic Voltage and Frequency Scaling, DVFS) technology according to a computing capability requirement of a currently running application program.

Step 208: After the first time, if the working temperature of the chip does not reach any one of the multiple preset temperature thresholds, decrease the working frequency of the chip once or multiple times according to a clock frequency decrease value or a clock frequency decrease proportion, where the clock frequency decrease value or the clock frequency decrease proportion corresponds to the one of the multiple temperature thresholds, until an obtained working temperature of the chip reaches any one of the multiple preset temperature thresholds. Go back to execute step 201.

Specifically, after the working frequency and the working voltage of the chip are decreased, because the working temperature of the chip is also related to other factors (for example, a heat dissipation condition of a fan), the working temperature of the chip may not be decreased significantly and the working temperature of the chip may not reach any working threshold in the first time. Therefore, according to a clock frequency decrease value or a clock frequency decrease proportion, where the clock frequency decrease value or the clock frequency decrease proportion corresponds to one of the multiple temperature thresholds (for example, a chip performance control policy corresponding to the 80 degrees centigrade is used last time, and a chip performance control policy corresponding to the 80 degrees centigrade may also be used this time), the working frequency of the chip may be decreased once or multiple times, until an obtained working temperature of the chip reaches any one of the multiple preset temperature thresholds.

Specifically, when the working temperature of the chip is excessively high, an effect of decreasing the working temperature of the chip can be achieved by using a chip performance control policy. Meanwhile, when the working temperature is lower than the safe temperature of the chip, the chip performance can also be improved accordingly, thereby improving the chip performance at the working temperature as much as possible in the case that safe working of the chip is ensured.

With the method for controlling chip performance provided in another embodiment of the present invention, because multiple temperature thresholds are preset and the multiple temperature thresholds correspond to multiple chip performance control policies, when a working temperature of a chip is obtained and the working temperature of the chip reaches one of the multiple temperature thresholds, working of the chip can be controlled according to a chip performance control policy that corresponds to the temperature threshold. Compared with the prior art, in this embodiment of the present invention, multiple temperature thresholds are set, which correspond to different chip performance control policies, so that when the temperature of the chip is excessively high, a problem that the chip is reset directly or working performance of the chip is decreased greatly is avoided, and it is convenient for a user to apply the chip.

Figure 3:
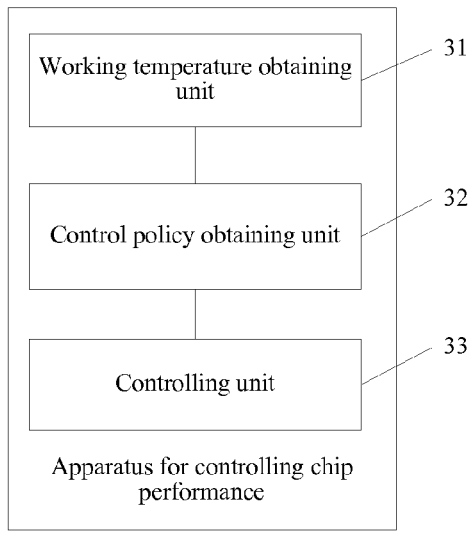
FIG. 3 is a first schematic structural diagram of an apparatus for controlling chip performance according to an embodiment of the present invention.

As shown in FIG. 3, an embodiment of the present invention provides an apparatus for controlling chip performance, where the apparatus includes:

a working temperature obtaining unit 31, configured to obtain a working temperature of a chip, where, for a specific implementation manner, reference is made to step 101 in FIG. 1, which is not further described herein;

a control policy obtaining unit 32, configured to, when the working temperature of the chip, which is obtained by the working temperature obtaining unit 31, reaches one of multiple preset temperature thresholds, obtain, according to preset correspondence between a temperature threshold and a chip performance control policy, a chip performance control policy that corresponds to the one of the multiple temperature thresholds, where, for a specific implementation manner, reference is made to step 102 in FIG. 1, which is not further described herein; and a controlling unit 33, configured to control working of the chip according to the control policy, where, for a specific implementation manner, reference is made to step 103 in FIG. 1, which is not further described herein.

Figure 4:
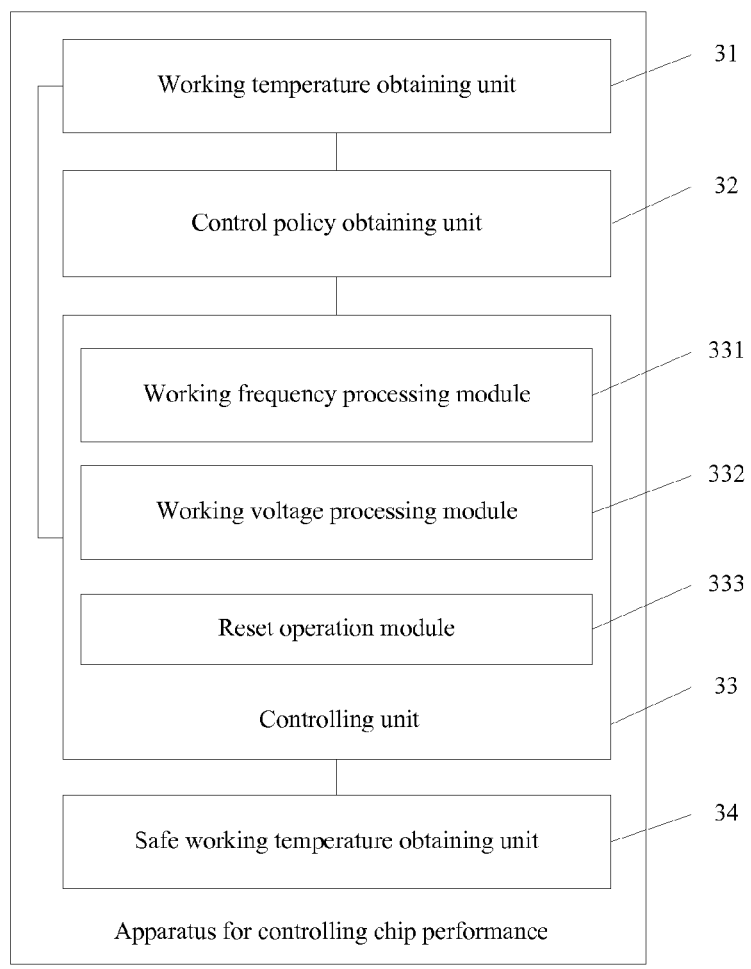
FIG. 4 is a second schematic structural diagram of an apparatus for controlling chip performance according to an embodiment of the present invention.

Further, as shown in FIG. 4, the chip performance control policy includes clock frequency decrease information that corresponds to each of the multiple temperature thresholds and the clock frequency decrease information includes a clock frequency decrease value or a clock frequency decrease proportion. The control policy obtaining unit 32 is specifically configured to:

obtain a clock frequency decrease value or a clock frequency decrease proportion, where the clock frequency decrease value or the clock frequency decrease proportion corresponds to the one of the multiple temperature thresholds, and for a specific implementation manner, reference is made to step 202 in FIG. 2, which is not further described herein.

The controlling unit 33 includes:

a working frequency processing module 331, configured to decrease a working frequency of the chip according to the clock frequency decrease value or the clock frequency decrease proportion, where, for a specific implementation manner, reference is made to step 203 in FIG. 2, which is not further described herein; and a working voltage processing module 332, configured to decrease, according to preset correspondence between a working frequency of a chip and a working voltage of a chip, a working voltage of the chip after the working frequency of the chip is decreased, where, for a specific implementation manner, reference is made to step 204 in FIG. 2, which is not further described herein.

Further, as shown in FIG. 4, a maximum threshold of the multiple temperature thresholds is a reset threshold, and the controlling unit 33 includes:

a reset operation module 333, configured to perform a reset operation on the chip when the working temperature of the chip reaches a preset reset threshold, where, for a specific implementation manner, reference is made to step 205 in FIG. 2, which is not further described herein.

Further, as shown in FIG. 4, the apparatus further includes:

a safe working temperature obtaining unit 34, configured to obtain a safe working temperature of the chip, where, for a specific implementation manner, reference is made to step 207 in FIG. 2, which is not further described herein.

the working temperature obtaining unit 34 is specifically configured to:

obtain a working temperature of the chip and continue for a preset first time after the working frequency of the chip and the working voltage of the chip are deceased, where, for a specific implementation manner, reference is made to step 206 in FIG. 2, which is not further described herein.

The controlling unit 33 is further configured to increase the working frequency of the chip and the working voltage of the chip if the working temperature of the chip, which is obtained in the first time, is lower than the safe working temperature, where, for a specific implementation manner, reference is made to step 207 in FIG. 2, which is not further described herein.

Further, as shown in FIG. 4, the working frequency processing module 331 is further configured to:

after the first time, if the working temperature of the chip does not reach any one of the multiple preset temperature thresholds, decrease the working frequency of the chip once or multiple times according to the clock frequency decrease value or the clock frequency decrease proportion, where the clock frequency decrease value or the clock frequency decrease proportion corresponds to the one of the multiple temperature thresholds, until an obtained working temperature of the chip reaches any one of the multiple preset temperature thresholds, where, for a specific implementation manner, reference is made to step 208 in FIG. 2, which is not further described herein.

With the apparatus for controlling chip performance provided in this embodiment of the present invention, because multiple temperature thresholds are preset and the multiple temperature thresholds correspond to multiple chip performance control policies, when a working temperature of a chip is obtained and the working temperature of the chip reaches one of the multiple temperature thresholds, working of the chip can be controlled according to a chip performance control policy that corresponds to the temperature threshold. Compared with the prior art, in this embodiment of the present invention, multiple temperature thresholds are set, which correspond to different chip performance control policies, so that when the temperature of the chip is excessively high, a problem that the chip is reset directly or working performance of the chip is decreased greatly is avoided, and it is convenient for a user to apply the chip.

Through the foregoing description of the embodiments, persons skilled in the art may clearly understand that the present invention may be implemented by software plus necessary general hardware, and definitely may also be implemented by hardware, but in many cases, the software implementation is preferred. Based on such an understanding, the technical solutions of the present invention essentially, or the part contributing to the prior art may be implemented in the form of a software product. The computer software product is stored in a readable storage medium, for example, a floppy disk, hard disk, or optical disk of the computer, and includes several instructions for instructing a computer device (which may be personal computer, a server, a network device, or the like) to perform the methods described in the embodiments of the present invention.

The foregoing descriptions are merely specific embodiments of the present invention, but are not intended to limit the protection scope of the present invention. Any variation or replacement readily figured out by persons skilled in the art within the technical scope disclosed in the present invention shall all fall within the protection scope of the present invention. Therefore, the protection scope of the present invention shall be subject to the protection scope of the claims.

What is claimed is:

1. A method for controlling chip performance, comprising: obtaining a working temperature of a chip; when the working temperature of the chip reaches one of multiple preset temperature thresholds, obtaining, according to a preset correspondence between a temperature threshold and a chip performance control policy, the chip performance control policy corresponds to the one of the multiple temperature thresholds; and controlling working of the chip according to the chip performance control policy, wherein the chip performance control policy comprises clock frequency decrease information that corresponds to each of the multiple temperature thresholds, the clock frequency decrease information comprises a clock frequency decrease value or a clock frequency decrease proportion, and the obtaining the chip performance control policy that corresponds to the one of the multiple temperature thresholds comprises: obtaining the clock frequency decrease value or the clock frequency decrease proportion, wherein the clock frequency decrease value or the clock frequency decrease proportion corresponds to the one of the multiple temperature thresholds; and the controlling the working of the chip according to the control policy comprises: decreasing a working frequency of the chip according to the clock frequency decrease value or the clock frequency decrease proportion, and decreasing, according to preset correspondence between a working frequency of an additional chip and a working voltage of the additional chip, a working voltage of the chip after the working frequency of the chip is decreased.

2. The method according to claim 1, wherein a maximum threshold of the multiple temperature thresholds is a reset threshold, and the controlling the working of the chip according to the control policy comprises:
performing a reset operation on the chip when the working temperature of the chip reaches a preset reset threshold.

3. The method according to claim 1, further comprising:
obtaining a safe working temperature of the chip;
obtaining the working temperature of the chip and continuing for a preset first time after the working frequency of the chip and the working voltage of the chip are decreased; and
increasing the working frequency of the chip and the working voltage of the chip if the working temperature of the chip, which is obtained in the preset first time, is lower than the safe working temperature.

4. The method according to claim 3, further comprising:
after the first time, if the working temperature of the chip does not reach any one of the multiple preset temperature thresholds, decreasing the working frequency of the chip at least one time according to the clock frequency decrease value or the clock frequency decrease proportion, wherein the clock frequency decrease value or the clock frequency decrease proportion corresponds to the one of the multiple temperature thresholds, until an obtained working temperature of the chip reaches any one of the multiple preset temperature thresholds.

5. An apparatus for controlling chip performance, comprising: a processing hardware; and a non-transitory computer readable medium configured with computer-executable instructions that, when executed by the processing hardware, facilitate performing a method on the apparatus including: obtaining a working temperature of a chip; obtaining when the working temperature of the chip reaches one of multiple preset temperature thresholds, according to a preset correspondence between a temperature threshold and a chip performance control policy, the chip performance control policy corresponds to the one of the multiple temperature thresholds; and controlling working of the chip according to the chip performance control policy, wherein the chip performance control policy comprises clock frequency decrease information that corresponds to each of the multiple temperature thresholds, wherein the clock frequency decrease information comprises a clock frequency decrease value or a clock frequency decrease proportion, and wherein the obtaining the chip performance control policy that corresponds to the one of the multiple temperature thresholds comprises: obtaining the clock frequency decrease value or the clock frequency decrease proportion, wherein the clock frequency decrease value or the clock frequency decrease proportion corresponds to the one of the multiple temperature thresholds; and wherein the controlling the working of the chip according to the control policy comprises: decreasing a working frequency of the chip according to the clock frequency decrease value or the clock frequency decrease proportion, and decreasing, according to preset correspondence between a working frequency of an additional chip and a working voltage of the additional chip, a working voltage of the chip after the working frequency of the chip is decreased.

6. The apparatus according to claim 5, wherein a maximum threshold of the multiple temperature thresholds is a reset threshold, and the controlling unit comprises:
a reset operation module, configured to perform a reset operation on the chip when the working temperature of the chip reaches a preset reset threshold.

7. The apparatus according to claim 5, wherein the method further comprises:
obtaining a safe working temperature of the chip,
wherein the obtaining a safe working temperature of the chip comprises:
obtaining the working temperature of the chip and continuing for a preset first time after the working frequency of the chip and the working voltage of the chip are decreased; and
wherein the controlling further comprises increasing the working frequency of the chip and the working voltage of the chip, if the working temperature of the chip, which is obtained in the preset first time, is lower than the safe working temperature.

8. The apparatus according to claim 7, wherein the working frequency processing module is further configured to:
after the preset first time, if the working temperature of the chip does not reach any one of the multiple preset temperature thresholds, decrease the working frequency of the chip at least one time according to the clock frequency decrease value or the clock frequency decrease proportion, wherein the clock frequency decrease value or the clock frequency decrease proportion corresponds to the one of the multiple temperature thresholds, until an obtained working temperature of the chip reaches any one of the multiple preset temperature thresholds.

* * * * *